(12) United States Patent
Kim

(10) Patent No.: US 7,098,133 B2
(45) Date of Patent: Aug. 29, 2006

(54) METHOD OF FORMING COPPER WIRING IN A SEMICONDUCTOR DEVICE

(75) Inventor: Si Bum Kim, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 81 days.

(21) Appl. No.: 10/616,722

(22) Filed: Jul. 10, 2003

(65) Prior Publication Data

US 2004/0009659 A1    Jan. 15, 2004

(30) Foreign Application Priority Data

Jul. 11, 2002    (KR) ............... 10-2002-0040462

(51) Int. Cl.
*H01L 21/44* (2006.01)
(52) U.S. Cl. .................................... 438/687
(58) Field of Classification Search ............... 438/626, 438/631–634, 645, 584, 597, 669, 672, 674, 438/687
See application file for complete search history.

(56) References Cited

U.S. PATENT DOCUMENTS

| | | | |
|---|---|---|---|
| 5,256,565 A * | 10/1993 | Bernhardt et al. ........... | 438/631 |
| 6,176,992 B1 * | 1/2001 | Talieh ........................... | 205/87 |
| 6,319,834 B1 | 11/2001 | Erb et al. | |
| 6,402,592 B1 * | 6/2002 | Zhu et al. ..................... | 451/36 |
| 6,518,185 B1 * | 2/2003 | Wang et al. .................. | 438/687 |
| 6,537,913 B1 * | 3/2003 | Modak .......................... | 438/687 |
| 6,649,513 B1 * | 11/2003 | Tsai et al. ..................... | 438/626 |
| 6,653,226 B1 * | 11/2003 | Reid .............................. | 438/631 |
| 6,696,358 B1 * | 2/2004 | Mukherjee et al. .......... | 438/622 |

(Continued)

FOREIGN PATENT DOCUMENTS

JP    11238703    8/1999

OTHER PUBLICATIONS

Office Action issued by the Korean Intellectual Property Office dated May 10, 2005 (3 pages).

*Primary Examiner*—Scott B. Geyer
(74) *Attorney, Agent, or Firm*—Marshall, Gerstein & Borun LLP

(57) ABSTRACT

Disclosed is a method of forming a copper wiring in a semiconductor device. A copper barrier metal layer and a copper seed layer are sequentially formed along the surface of an interlayer insulating film including damascene patterns. In a state that a wafer is then loaded onto an electrical plating apparatus in which a copper plating solution is filled and a negative (−) power supply is also applied to the wafer, copper is plated so that the damascene patterns are sufficiently filled, thereby forming a copper layer. Next, the copper layer is polished in the plating solution by means of the electro-polishing process by changing the negative (−) power supply to the positive (+) power supply. Due to this, the surface of the copper layer is flat over the entire wafer. Thereafter, a chemical mechanical polishing process is performed until the surface of the interlayer insulating film is exposed, thereby forming copper wirings within the damascene patterns. As such, an uneven surface of the copper layer plated by the electroplating method is etched in the plating solution, thus making flat the surface of the copper layer and thin the thickness of the copper layer. It is thus possible to prevent a dishing phenomenon or an erosion phenomenon in a subsequent chemical mechanical polishing process. Therefore, the process margin of the chemical mechanical polishing process could be increased and process characteristics could be improved.

7 Claims, 2 Drawing Sheets

U.S. PATENT DOCUMENTS

| | | | |
|---|---|---|---|
| 6,706,166 B1 * | 3/2004 | Chou et al. | 205/96 |
| 6,739,953 B1 * | 5/2004 | Berman et al. | 451/41 |
| 6,774,039 B1 * | 8/2004 | Drewery | 438/687 |
| 2002/0115283 A1 * | 8/2002 | Ho et al. | 438/633 |
| 2004/0214431 A1 * | 10/2004 | Shieh et al. | 438/689 |
| 2004/0253809 A1 * | 12/2004 | Yao et al. | 438/631 |

* cited by examiner

METHOD OF FORMING COPPER WIRING IN A SEMICONDUCTOR DEVICE

BACKGROUND

1. Technical Field

A method of forming copper wiring in a semiconductor device is disclosed. More particularly, a method of forming copper wiring in a semiconductor device capable of preventing a dishing phenomenon or an erosion phenomenon occurring on the surface of the copper wiring when the copper wiring is formed in damascene patterns by polishing the copper layer using a chemical mechanical polishing (CMP) process.

2. Description of the Related Art

In general, as the semiconductor industry shifts to ultra large-scale integration (ULSI), the geometry of semiconductor devices is narrowed to a sub-half-micron scale. The circuit density is increased improve performance and reliability. Thin copper films can improve reliability of the semiconductor device since they have a higher melting point than aluminum and thus have a higher resistance to electromigration (EM). Further, thin copper films can increase the signal transfer rate due to their low resistivity. Accordingly, when forming metal wirings in semiconductor devices, thin copper films have been used as an interconnection material useful for integration circuits.

Today, available methods of burying copper include a physical vapor deposition (PVD) method, a reflow method, a chemical vapor deposition method (CVD) method, an electroplating method, an electroless-plating method, and the like. Of them, the electroplating method and the CVD method, which have good copper burial characteristics, have been preferably used.

A damascene scheme has been widely used by which a via contact hole to which a lower layer will be electrically connected and a trench where a metal wiring will be located are simultaneously formed in the process of forming the copper wirings in the semiconductor device, while using copper as the material for the metal wiring. At this time, an insulating material of a low dielectric constant is used as an interlayer insulating film on which the damascene patterns will be formed.

In order to form copper wirings in damascene patterns having a via contact hole and a trench, copper is buried within the damascene patterns by the above method. The buried copper layer is then polished by means of the CVD process, thereby isolating it from a neighboring copper wiring.

Referring now to FIG. 1, a method of forming the copper wirings in the semiconductor device using the electroplating method according to a first embodiment of the prior art will be described.

An interlayer insulating film 11 is formed on a substrate 10. A plurality of damascene patterns 12 having different densities from the interlayer insulating film 11 are then formed by means of a damascene scheme.

Next, a copper barrier metal layer 13 and a copper seed layer 14 are sequentially formed along the surface of the interlayer insulating film 11 including the plurality of the damascene patterns 12. At this time, the copper bearing metal layer 13 may be formed using one of ionized PVD TiN, CVD TiN, MOCVD TiN, ionized PVD Ta, ionized PVD TaN, CVD Ta, CVD TaN and CVD WN. Further, the copper seed layer 14 may be formed using various methods but is preferably formed using an ionized PVD method. A wafer on which the copper seed layer 14 is formed is loaded onto the electroplating apparatus in which a copper plating solution to which organic additives of two types called an accelerator and a suppressor are added is filled. With a negative (−) power supply applied to the wafer, copper is plated until the damascene patterns 12 are sufficiently filled, so that a copper layer 15 is formed.

Thereafter, the copper layer 15, the copper seed layer 14 and the copper barrier metal layer 13 are sequentially polished by means of chemical mechanical polishing process until the to surface of the interlayer insulating film 11 is exposed. Copper wirings are thus formed within the plurality of the damascene patterns 12.

In the above first embodiment, the organic additives of the two types called the accelerator and the suppressor are added to the copper plating solution in order to sufficiently fill the damascene patterns 12. During the electroplating process, a phenomenon occurring due to a reciprocal action of these additives, i.e., a "bumping phenomenon" or "sloping phenomenon" occurs at portions where the damascene patterns 12 are densely formed, as shown in FIG. 1. At this time, the thickness of the copper layer 15 at the portions where the bumping phenomenon occurs becomes unnecessarily thicker than other portions. IF the chemical mechanical polishing process is performed in this state, there is a problem that a "dishing" phenomenon or an "erosion" phenomenon may occur on the top surface of the copper wiring.

FIG. 2 is a cross-sectional view of a semiconductor device for explaining a method of forming the copper wirings in the device using the electroplating method according to a second embodiment of the prior art. The purpose of the second embodiment is to propose a solution for solving the problems encountered in the first embodiment.

It should be noted that the method of forming the copper wirings according to the second embodiment is similar to the first embodiment. Therefore, the same processes of the second embodiment to those of the first embodiment will not be explained but other portions different from the first embodiment will be explained.

In FIG. 2, a reference numeral '20' indicates a substrate, a reference numeral '21' indicates an interlayer insulating film, a reference numeral '22' indicates a damascene pattern, a reference numeral '23' indicates a copper barrier metal layer, a reference numeral '24' indicates a copper seed layer, and a reference numeral '25' indicates a copper layer.

In the second embodiment, unlike the first embodiment, a copper electroplating process is performed by adding a third additive called a leveler to the copper plating solution to which the organic additives of the two kinds called the accelerator and the suppressor are added. By adding the third additive called the leveler, the bumping or also sloping phenomenon occurring at the portions where the damascene patterns 22 are densely formed is less severe than in the first embodiment, as shown in FIG. 2. Though the bumping phenomenon in the second embodiment is less severe than in the first embodiment, the portions where the damascene patterns 22 are densely formed are unnecessarily thicker than those where the damascene patterns 22 are not densely formed. This presents a problem with respect to the subsequent chemical mechanical polishing process. Further, the amount of the additives increase due to addition of another organic additive. Accordingly, there is a problem that physical characteristics such as an electrical characteristic, etc. are degraded since a problem that the organic impurity may be introduced within the copper wirings is increased.

SUMMARY OF THE DISCLOSURE

Accordingly, a method of forming copper wirings in semiconductor devices is disclosed that is capable of preventing a dishing phenomenon or an erosion phenomenon occurring on the surface of the copper wirings when the copper wirings are formed in damascene patterns by polishing a copper layer using a chemical mechanical polishing (CMP) process, whereby electrical characteristics and reliability of the devices are improved.

In an embodiment, a method of forming copper wirings in semiconductor devices comprises: forming damascene patterns in an interlayer insulating film which is formed on a substrate; sequentially forming a copper barrier metal layer and a copper seed layer on the surface of the interlayer insulating film including the damascene patterns; performing a copper electroplating to be filled the damascene patterns with a copper layer; polishing the copper layer by means of a copper electro-polishing process to form a polished copper layer having a flat surface and a thin thickness; and polishing the polished copper layer, the copper layer and the copper barrier metal layer by means of a chemical mechanical polishing process so that the top surface of the interlayer insulating film is exposed, thereby forming copper wirings within the damascene patterns.

In another embodiment, a method of forming copper wirings in semiconductor devices comprises: forming damascene patterns in an interlayer insulating film which is formed on a substrate; sequentially forming a copper barrier metal layer and a copper seed layer on the surface of the interlayer insulating film including the damascene patterns; performing a copper electroplating process to be filled the damascene patterns with a copper layer; polishing the copper layer and the copper seed layer by means of a copper electro-polishing process until the copper barrier metal layer is exposed, thus forming copper wirings within the damascene patterns; and polishing the copper barrier metal layer by means of a chemical mechanical polishing process until the surface of the interlayer insulating film is exposed.

Additional advantages are features of the disclosed methods will be set forth in part in the description which follows and in part will become apparent to those having ordinary skill in the art upon examination of the following or may be learned from practice. Other advantages may be realized and attained by the structure particularly pointed out in the written description and claims hereof as well as the appended drawings.

It is to also understood that both the foregoing general description and the following detailed description are exemplary and explanatory and are intended to provide further explanation of the disclosed methods as claimed.

DETAILED DESCRIPTION OF THE PRESENTLY PREFERRED EMBODIMENT

Reference will now be made in detail to the preferred embodiments of, examples of which are illustrated in the accompanying drawings.

Figure 1:
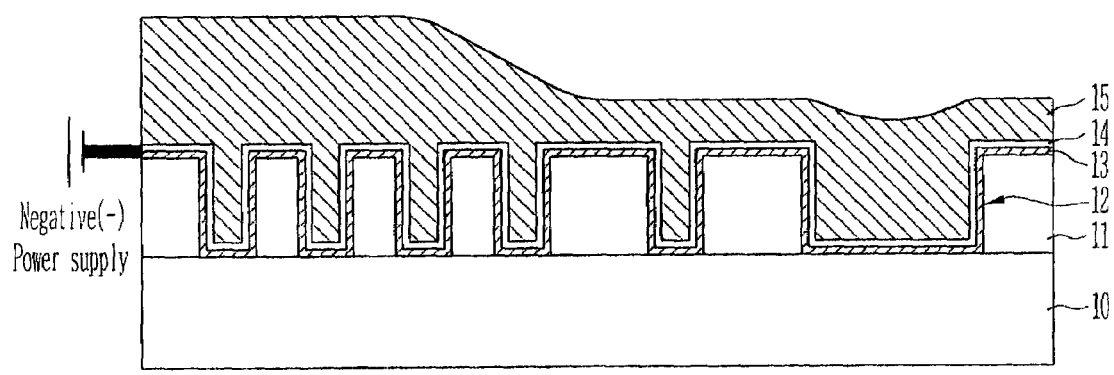
FIG. 1 is a cross-sectional view of a semiconductor device for explaining a method of forming copper wirings in the device using an electroplating method according to a first embodiment of the prior art.
Figure 2:
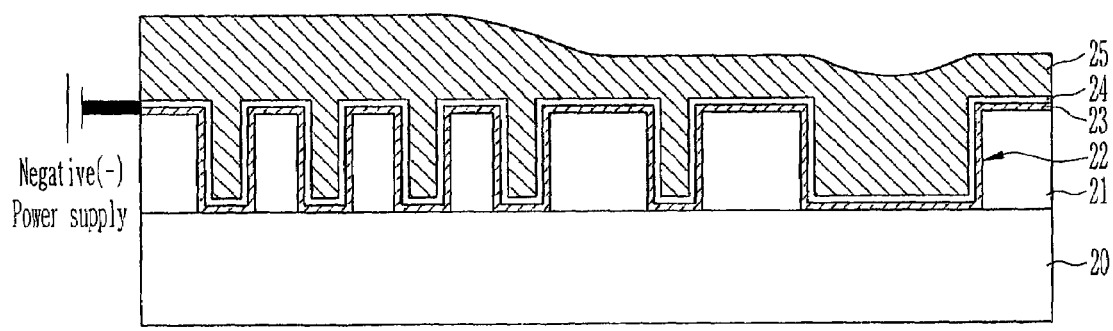
FIG. 2 is a cross-sectional view of a semiconductor device for explaining a method of forming copper wirings in the device using an electroplating method according to a second embodiment of the prior art.
Figure 3A:
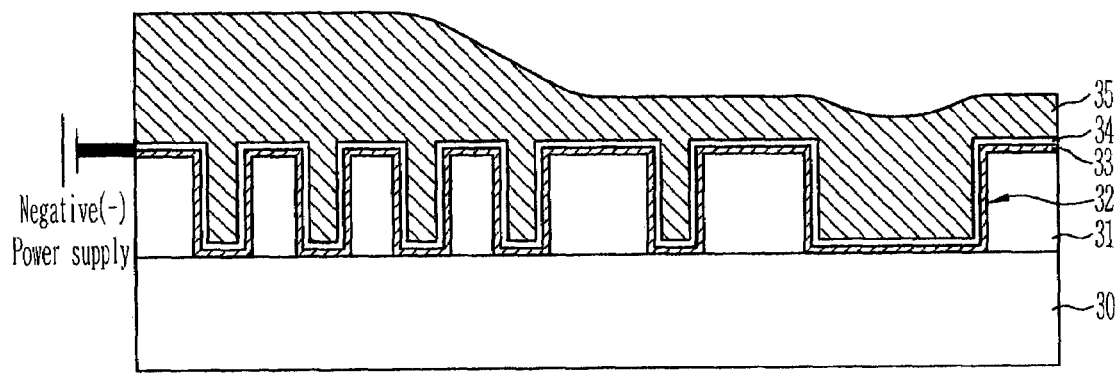
FIG. 3A through FIG. 3C are cross-sectional views of semiconductor devices for explaining a method of forming copper wirings in the device using an electroplating method according to a embodiment.
Figure 3B:
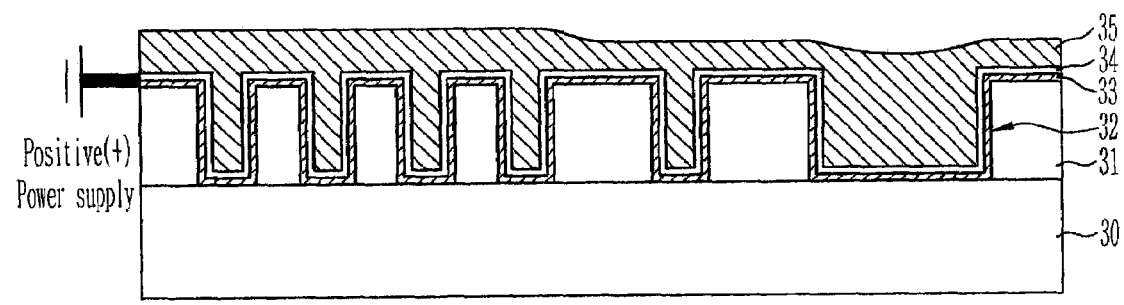
Figure 3C:
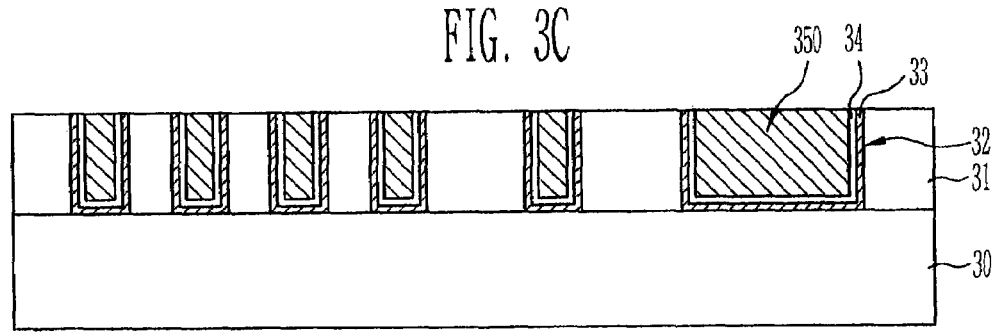

FIG. 3A through FIG. 3C are cross-sectional views of semiconductor devices for explaining a method of forming copper wirings in the device using an electroplating method according to a preferred embodiment.

Referring now to FIG. 3A, an interlayer insulating film 31 is formed on a substrate 30. A plurality of damascene patterns 32 having different densities are then formed in the interlayer insulating film 31 by means of a damascene scheme. Next, a copper barrier metal layer 33 and a copper seed layer 34 are sequentially formed along the surface of the interlayer insulating film 31 including the plurality of the damascene patterns 32. Thereafter, a copper layer 35 is formed by means of a copper electroplating method so that the plurality of the damascene patterns 32 in which the copper seed layer 34 is formed are sufficiently filled.

In the above, the copper barrier metal layer 33 may be formed using one of ionized PVD TiN, CVD TiN, MOCVD TiN, ionized PVD Ta, ionized PVD TaN, CVD Ta, CVD TaN and CVD WN. Further, the copper seed layer 34 may be formed using various methods but is preferably formed using the ionized PVD method.

At this time, the copper layer 35 may be formed by the following processes: a wafer in which the copper seed layer 34 is formed is loaded onto the electroplating apparatus in which a copper plating solution to which organic additives of two kinds called an accelerator and a suppressor are added is filled, and copper is then plated at a target thickness in the range of 5000~15000 Å until the damascene patterns 32 are sufficiently filled in a state that a negative (−) power supply having current in the range of 1~5 A is applied to the wafer. Also, the copper layer 35 may be formed by the following processes: a wafer in which the copper seed layer 34 is formed is loaded onto the electroplating apparatus in which the copper plating solution to which the organic additives of three kinds called the accelerator, the suppressor and a leveler are added is filled, and copper is then plated at a target thickness in the range of 5000~15000 Å until the damascene patterns 32 are sufficiently filled in a state that a negative (−) power supply having current in the range of 1~5 A is applied to the wafer.

Referring to FIG. 3B, in the state that the copper layer 35 is sufficiently thickly formed by the copper electroplating process and the wafer is dipped into the plating solution of the electroplating apparatus, the power supply applied to the wafer is changed from the negative (−) power supply to a positive (+) power supply, so that the copper layer 35 is polished by means of an electro-polishing process. Therefore, the copper layer 35 having a flat surface over the entire wafer and a thinned thickness is formed.

In the above, the electro-polishing process includes polishing the copper layer 35 using a target thickness in the range of 5000 . 15000 Å same or similar to the plating thickness in a state that the positive (+) power supply having current in the range of 1~30 A is applied to the wafer. At this time, due to application of the positive (+) power supply, the potential is concentrated on the projections along the shape of the surface of the wafer, i.e., the shape of the surface of the copper layer 35. As the rate of the electro-polishing process at the projections becomes thus faster than those at the flat portions, the copper layer 35 is flat over the entire wafer.

Referring to FIG. 3C, the flat and thin copper layer 35, the copper seed layers 34 and the copper barrier metal layer 33 are sequentially polished by means of the chemical mechanical polishing process until the top surface of the interlayer insulating film 31 is exposed, so that copper wirings are formed within the plurality of the damascene patterns 32.

Meanwhile, unlike the description made referring to FIG. 3B, the electro-polishing process is continuously performed even after it is performed until the surface of the copper layer 35 is flat, whereby the copper barrier metal layer 33 is exposed. Due to this, copper wirings 350 are formed within the plurality of the damascene patterns 32. In this electro-polishing process, after the copper layer 35 is all polished in a state that the positive (+) power supply is applied to the copper layer 35 and the copper barrier metal layer 33, the positive (+) power supply is applied to the copper barrier metal layer 33 only. At this time, this electro-polishing process causes a self-stopping phenomenon by user of an electrical characteristic that the electrical resistance of a material used as the copper barrier metal layer 33 is significantly higher than copper. Therefore, the electro-polishing process is automatically stopped. That is, the copper electro-polishing process until an electrical resistance of the copper barrier metal layer is detected. In this state, unlike the description made by reference to FIG. 3B, the chemical mechanical polishing process can complete the copper wirings by polishing the copper barrier metal layer 33 only without polishing copper.

As described above, after the copper layer is thinly formed by means of the copper electroplating method, the surface of the copper layer is made thin by means of the electro-polishing process. Therefore, the disclosed methods have advantageous effects that it can prevent a dishing phenomenon or an erosion phenomenon of copper wirings due to a bumping phenomenon occurring in the existing copper layer, and also increase the process margin in a chemical mechanical polishing process. Also, as an electro-polishing process is performed in order for the copper layer to remain within the damascene patterns, it is required that the copper barrier metal layer only be polished without polishing the copper layer in a subsequent chemical mechanical polishing process. Therefore, the disclosed methods has an advantageous effect that it can significantly improve the process margin in the chemical mechanical polishing process.

The foregoing embodiments are merely exemplary and are not to be construed as limiting. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of forming a copper wiring in a semiconductor devices, the method comprising:
   forming damascene patterns in an interlayer insulating film which is formed on a substrate;
   sequentially forming a copper barrier metal layer and a copper seed layer on the surface of the interlayer insulating film including the damascene patterns;
   performing a copper electroplating process in an electroplating apparatus to fill the damascene patterns with a copper layer by applying a negative (−) power supply to the substrate;
   performing a copper electro-polishing process to remove the copper layer and the copper seed layer on the interlayer insulating film in the same electroplating apparatus that the copper electroplating process is performed by applying a positive (+) power supply to the copper layer and the copper barrier layer on the interlayer insulating film without the use of a pad so that the copper electro-polishing process is automatically stopped and the copper layer and the copper seed layer is remained in the damascene patterns when the copper barrier metal layer is exposed; and
   polishing the copper barrier metal layer on the interlayer insulating film by means of a chemical mechanical polishing process until the surface of the interlayer insulating film is exposed.

2. The method as claimed in claim 1, wherein the copper barrier metal layer is formed using one of ionized PVD TiN, CVD TiN, MOCVD TiN, ionized PVD Ta, ionized PVD TaN, CVD Ta, CVD TaN and CVD WN.

3. The method as claimed in claim 1, wherein the copper seed layer is formed using an ionized PVD method.

4. The method as claimed in claim 1, wherein the copper electroplating process comprises:
   loading the substrate on which the copper seed layer is formed onto the electroplating apparatus in which a copper plating solution including an organic accelerator and an organic suppressor are added;
   setting a plating target range so that the damascene patterns could be sufficiently filled; and
   applying the negative (−) power supply having current in the range of 1~5 A to the substrate.

5. The method as claimed in claim 1, wherein the copper electroplating process comprises:
   loading the substrate on which the copper seed layer is formed onto the electroplating apparatus in which a copper plating solution including an organic accelerator, an organic suppressor and an organic leveler are added;
   setting a plating target range so that the damascene patterns could be sufficiently filled; and
   applying the negative (−) power supply having current in a range of 1~5 A to the substrate.

6. The method as claimed in claim 1, wherein the copper electro-polishing process is performed by applying the positive (+) power supply having current in a range of 1~30 A to the copper layer and the copper barrier metal layer.

7. The method as claimed in claim 1, further comprising detecting that the copper barrier metal layer has been exposed by the electro-polishing process based on detecting an electrical resistance of the copper barrier metal layer.

* * * * *